United States Patent [19]

Moorman et al.

[11] Patent Number: 5,041,798
[45] Date of Patent: Aug. 20, 1991

[54] TIME REFERENCE WITH PROPORTIONAL STEERING

[75] Inventors: William A. Moorman, Woodstock; Timothy M. Slater, Hudson, both of N.Y.

[73] Assignee: International Business Machines Corporation, Armonk, N.Y.

[21] Appl. No.: 537,389

[22] Filed: Jun. 12, 1990

[51] Int. Cl.⁵ .................. H03L 7/085; H03L 7/18
[52] U.S. Cl. ..................... 331/1 A; 331/2; 331/17; 331/25
[58] Field of Search ............ 331/1 A, 25, 17, 2

[56] References Cited

U.S. PATENT DOCUMENTS 3,900,741  8/1975  Fletcher et al. ............... 307/204
4,239,982 12/1980  Smith et al. ................... 328/219 X
4,633,193 12/1986  Scordo ........................... 331/1 A
4,951,005  8/1990  Babin ........................... 331/1 A X Primary Examiner—Siegfried H. Grimm
Attorney, Agent, or Firm—William A. Kinnaman, Jr.

[57] ABSTRACT

A system for steering mutually phase-locked time-of-day (TOD) clocks in unison to a higher-precision reference clock. Periodically the count stored by a TOD counter responsive to one of the TOD clocks is compared with a reference count to provide an error signal. A proportional correction signal derived from the error signal is applied together with an offset to each of the TOD clocks to adjust the clock frequencies and thereby steer the TOD count toward the reference count. The steering offset is dynamically adjusted in such a manner that, when the offset signal is applied alone as a correction signal, the frequencies of the TOD clocks track that of the reference clock.

20 Claims, 4 Drawing Sheets

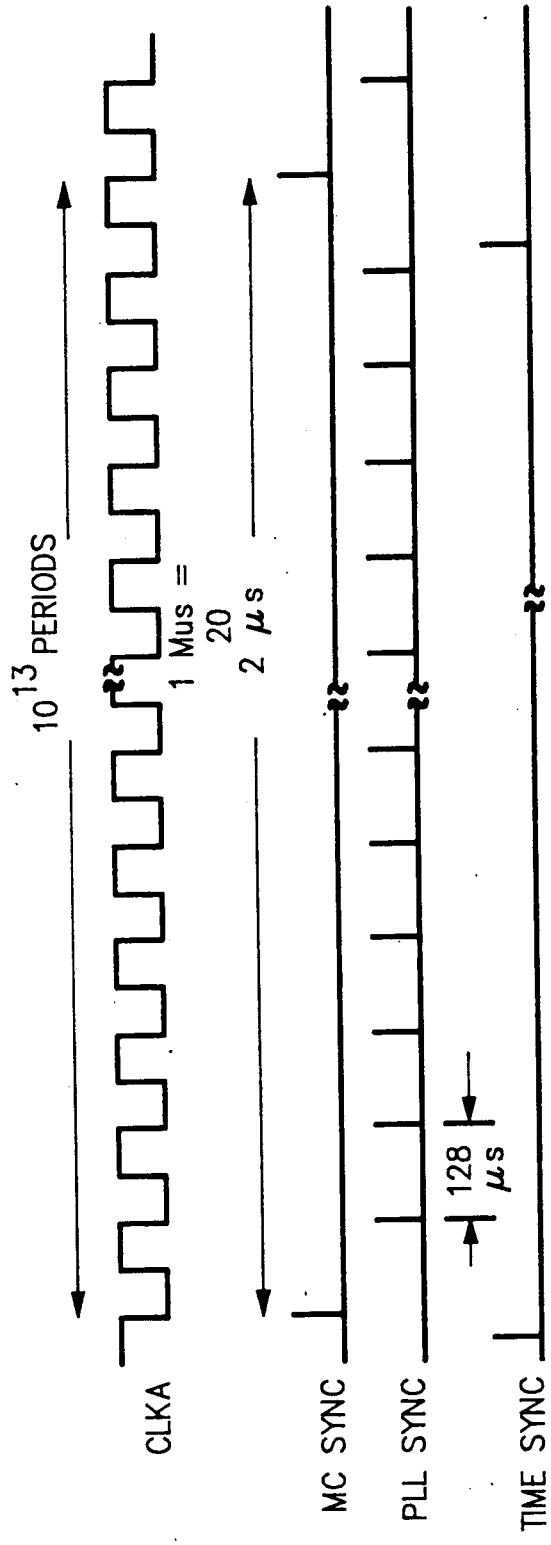
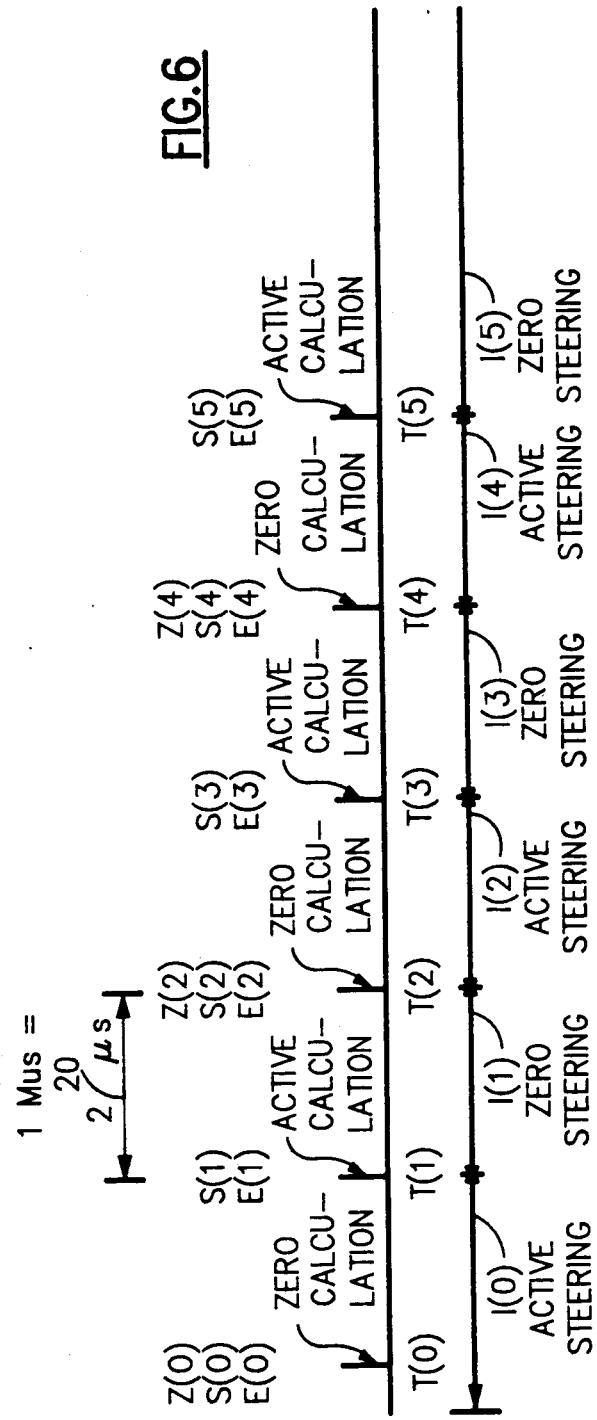

TIME REFERENCE WITH PROPORTIONAL STEERING

BACKGROUND OF THE INVENTION

1. Field of the Invention

This invention relates to an external time reference for a multicomputer complex and, in particular, to an external time reference with dynamic steering.

2. Description of the Related Art

Multicomputer complexes having computers that are widely separated (e.g., by distances of up to several kilometers) are relatively common in the art. The signal propagation delay between individual computers typically exceeds the period of the high-frequency time-of-day (TOD) clocks which are used by the computers to measure time intervals and to time-stamp events. TOD clocks for high-performance computers are typically driven at a frequency of several tens of megahertz. Accordingly, maintaining absolute synchronism between such high-frequency clocks is difficult and often not attempted. It is nevertheless desirable, however, for such a multicomputer complex to have synchronized lower-frequency clock signals for such purposes as cross-system time-stamping and the like. Such clock signals may have frequencies on the order of several kilohertz.

What are particularly desirable are TOD clocks that accomplish both objectives simultaneously. That is, clocks that have a high resolution for internal time-stamping purposes (i.e., within a particular computer of the complex) but are also synchronized on a coarser scale with other clocks in the complex for cross-system time-stamping. This may be implemented by providing each computer with a slave TOD clock which is phase-locked to a system-wide clock which runs at a submultiple of the TOD clock frequency.

Synchronized clock signals of the type referred to above are typically implemented by providing one or more clock sources at each computer location and phase-locking each clock source to a consensus signal derived from the other clock sources. Systems containing $3f+1$ such mutually coupled clock sources are capable of tolerating f individual points of failure and are disclosed in such references as Fletcher et al., U.S. Pat. No. 3,900,741, Smith et al. U.S. Pat. No. 4,239,982, and the copending applications of T. B. Smith, Ser. No. 262,416, filed Oct. 25, 1988, entitled "Synchronized Fault Tolerant Clocks for Multiprocessor Systems", now abandoned and of L. H. Appelbaum et al., Ser. No. 392,812, filed Aug. 11, 1989, entitled "Fault-Tolerant Clock for Multicomputer Complex", both of which applications are owned by the assignee of the present application.

Of particular interest are quad oscillator systems consisting of four mutually coupled clock sources which tolerate any single point of failure. Thus, the copending applications referred to above disclose quad systems in which two clock sources are associated with each of two physically separated external time reference units. The external time reference units are physically separated to reduce the likelihood that a common source of failure will affect both units simultaneously. Each computer receives two synchronized TOD clock signals, one from each unit, so that it may continue to receive a TOD clock signal for such purposes as time-stamping even if one of the clock sources or external time reference units should fail.

The quad oscillators of the clock sources, which are voltage controlled, are inherently less precise than a fixed-frequency oscillator. Accordingly, in order to increase the precision of the quad oscillator systems described in the copending applications referred to above, the quad oscillators may be "steered" to a higher-precision fixed-frequency time reference. Thus, as disclosed in the copending application of L. H. Appelbaum et al., the clock signal generated by one of the four mutually coupled oscillators is used to increment a TOD counter, while a higher-precision reference oscillator is likewise used to increment a reference counter. Periodically, the two counts are compared to derive an error signal, from which a steering correction signal is generated and supplied to each of the four oscillators, together with any other correction signals generated by the individual phase-lock loops (PLLs).

In the system described in the copending application of Appelbaum et al., the steering signal applied to the individual oscillators is of fixed magnitude, but of a sign determined by the discrepancy between the TOD count and the reference count. This results in a system in which the TOD time as indicated by the TOD count tracks the reference time in a sawtooth fashion rather than approaching the reference time asymptotically. It would be desirable to have an external time reference system in which the TOD time tracked the reference time more closely, despite deviations in individual oscillators from their design specifications.

SUMMARY OF THE INVENTION

In general our invention contemplates a system for steering mutually phase-locked time-of-day (TOD) clocks in unison to a higher-precision reference clock in which a TOD count stored by a TOD counter responsive to one of the TOD clocks is periodically compared with a reference count to provide an error signal. A proportional correction signal derived from the error signal is applied together with an offset to each of the TOD clocks frequencies and thereby steer the TOD count toward the reference count. The steering offset is dynamically adjusted in such a manner that when the offset signal is applied alone as a correction signal, the frequencies of the TOD clocks match that of the reference clock.

BRIEF DESCRIPTION OF THE DRAWINGS

FIG. 5 is a timing diagram illustrating the various control signals supplied to or generated by the control logic of the clock source shown in FIG. 3.

FIG. 6 is a timing diagram illustrating the operation of the steering circuitry shown in FIG. 4.

DESCRIPTION OF THE PREFERRED EMBODIMENT

Figure 1:
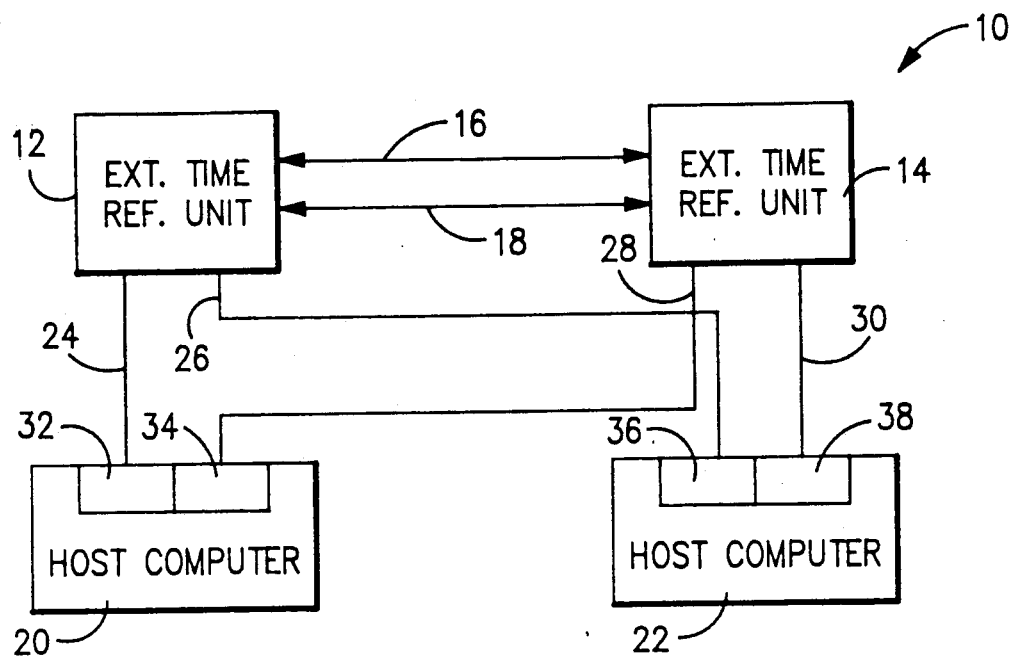
FIG. 1 is a schematic block diagram of a multicomputer complex incorporating our external time reference.

Referring now to FIG. 1 an external time reference 10 constructed in accordance with the present invention includes a pair of external time reference units 12 and 14 interconnected by respective duplex links 16 and 18. Units 12 and 14 supply time reference signals to a plurality of host computers, two of which, computers 20 and 22, are shown in FIG. 1. Each of computers 20 and 22 has a first port for receiving a signal from external time reference unit 12 and a second port for receiving a signal from external time reference unit 14. Thus, host computer 20 has a first port 32 for receiving a reference signal from external time reference 12 over line 24 and a second port 34 for receiving a reference signal from unit 14 over line 28. Similarly, host computer 22 has a first port 36 for receiving a reference signal from external time reference unit 12 via line 26 and a second port 38 for receiving a reference signal from external time reference unit 14 via line 30.

Figure 2:
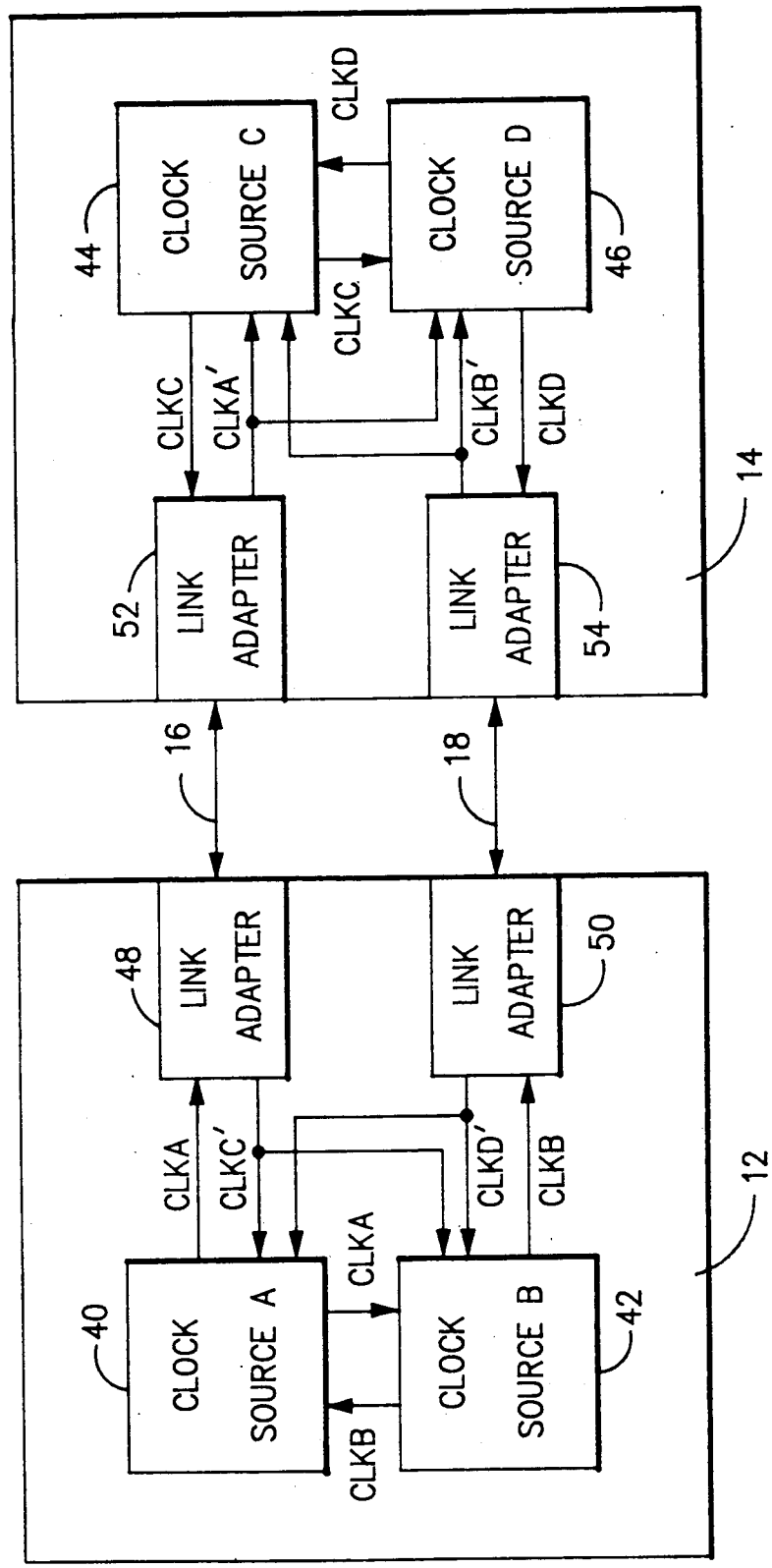
FIG. 2 is a schematic block diagram showing the interconnection between the individual clock sources of the external time reference shown in FIG. 1.

As shown in FIG. 2, external time reference unit 12 contains a pair of clock sources 40 and 42, also referred to herein as clock source A and clock source B, respectively. In a similar manner, external time reference unit 14 contains a pair of clock sources 44 and 46, also referred to herein as clock source C and clock source D, respectively. Clock source 40 supplies an internally generated clock signal CLKA directly to the other clock source 42 in the same unit 12. Clock source 40 also supplies its clock signal CLKA to a link adapter 48 in the unit 12, which supplies a suitably encoded signal for transmission over link 16. A link adapter 52 in the other unit 14, coupled to link 16, supplies a regenerated clock signal CLKA' to clock sources 44 and 46. In a similar manner, clock source B supplies its own clock signal CLKB directly to the other clock source 40 in unit 12 as well as to a link adapter 50 in unit 12 which is coupled to link 18. A link adapter 54 in unit 14 coupled to the other end of link 18 supplies a regenerated clock signal CLKB' to the clock sources 44 and 46 in that unit 14.

Likewise, in unit 14, clock source 44 supplies its own clock signal CLKC directly to clock source 46 as well as to the clock sources 40 and 42 in unit 12 via link adapter 52, link 16 and link adapter 48, which produces a regenerated clock signal CLKC'. Finally, clock source D in unit 14 supplies its clock signal CLKD directly to the other clock source 44 in unit 14 as well as to the clock sources 40 and 42 in unit 12 via link adapter 54, link 18 and link adapter 50, the latter link adapter producing a regenerated clock signal CLKD'.

Figure 3:
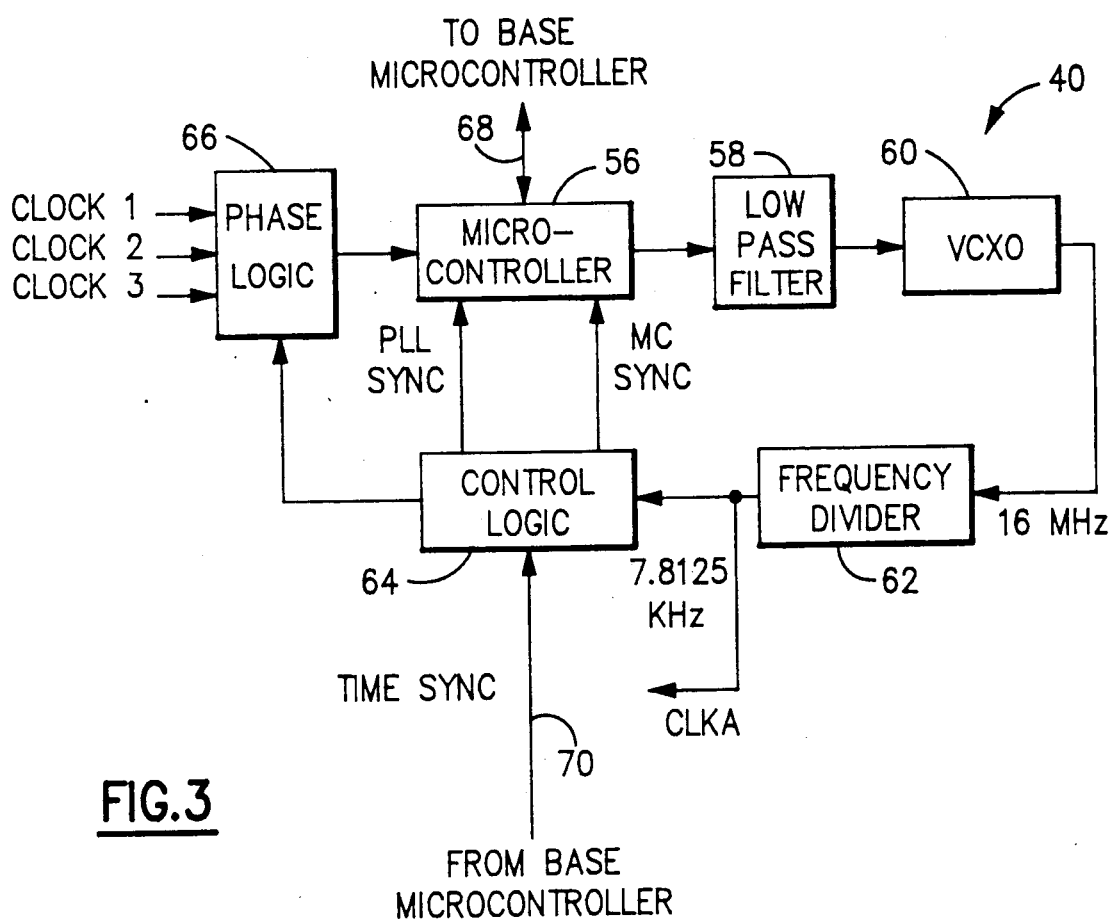
FIG. 3 is a schematic block diagram of one of the clock sources of the system shown in FIGS. 1 and 2.

Each of the clock sources 40 through 46 is similar in internal construction to clock source 40, which is shown in FIG. 3. As shown in the figure, clock source 40 contains a voltage-controlled crystal oscillator (VCXO) 60, which generates a square wave output having a nominal frequency of 16 MHz. A frequency divider 62 responsive to the output of oscillator 60 divides the frequency of the oscillator signal by a factor of 2048 ($2^{11}$) to provide 11 a lower-frequency clock signal CLKA having a nominal frequency of 7.8125 kHz. A phase logic circuit 66 is responsive to the clock signal CLKA as well as to external clock signals CLOCK1, CLOCK2, and CLOCK3 originating from the other clock sources 42 through 46.

In FIG. 3, CLOCK1 represents the clock of the other source in the same unit 12 (in this case signal CLKB from clock source 42), CLOCK2 represents the clock in the other unit sharing the same duplex link (in this case regenerated signal CLKC' from clock source 44), and CLOCK3 represents the clock in the other unit not sharing the same duplex link (in this case regenerated signal CLKD' from clock source 46). As described in more detail in the copending application of L. H. Appelbaum et al. referred to above, for every period of the clock signal CLKA, phase logic 66 compares the phase of each of the incoming clock signals CLK1 through CLK3 with that of the clock signal CLKA to generate digitized signals indicating the measured phase differences. These phase differences are stored in internal registers (not shown) of phase logic 66 and are read every period of the clock signal CLKA by a clock source microcontroller 56. Microcontroller 56 selects the median of the three phase differences measured by phase logic 66 and uses that median phase difference to derive a digital correction signal which it applies to a low-pass filter 58. Low-pass filter 58 converts the correction signal to analog form, filters it using an internal single-pole RC filter (not separately shown) and supplies the filtered correction signal to oscillator 60.

Microcontroller 56 receives PLL SYNC and MC SYNC signals from control logic 64, which is part of the clock source 40. Control logic 64 receives the CLKA signal from frequency divider 62 as well as a TIME SYNC signal from a line 70 originating from a base microcontroller 78 of unit 12, shown in FIG. 4. Microcontroller 56 of clock source 40 is also coupled to microcontroller 78 by way of lines 68. Lines 68 and 70 in FIG. 3 are shown collectively in FIG. 4 as a bus 84, which also extends to clock source 42.

Referring now to FIG. 5, control logic 64 normally generates a PLL SYNC pulse on each successive falling edge of the CLKA signal generated by frequency divider 62. This PLL SYNC signal signals microcontroller 56 to read the phase difference signals from phase logic 66 and generate a suitable correction signal for low-pass filter 58, as described above. Following each TIME SYNC signal on line 70 from base microcontroller 78, however, control logic 64 does not generate a PLL SYNC signal on the falling edge of the CLKA signal, but instead supplies microcontroller 56 with a MC SYNC signal on a separate line.

Microcontroller 56 responds to the MC SYNC signal from control logic 64 by entering a data transfer cycle in which it receives a steering signal from base microcontroller 78. This steering signal is superimposed on any correction signal otherwise generated as a result of the input from phase logic 66 to steer the oscillator 60 of clock source 40 towards a reference frequency in a manner to be described below.

On the next falling edge of clock signal CLKA following the data transfer cycle initiated by the TIME SYNC signal from microcontroller 78, and on each successive falling edge thereafter until another TIME SYNC signal appears, control logic 64 generates a PLL SYNC signal to cause clock source microcontroller 56 to enter another phase-lock control cycle in which it generates a correction signal from the phase difference signals received from phase logic 66 in the manner described above. As noted above, the correction signal applied to low-pass filter 58 has superimposed on it the steering signal received from base microcontroller 78 during the most recent data transfer cycle initiated by the TIME SYNC signal on line 70.

The corresponding oscillators 60 of the other clock sources 42-46 are steered in a similar manner by the steering signal from base microcontroller 78 so that the clock sources are steered in unison towards the reference frequency while at the same time remaining phase-locked to each other. In the embodiment shown, microcontroller 78 generates a TIME SYNC signal every 1.048576 seconds ($2^{20}$ microseconds); this time period is frequently referred to as a "Mus", or megamicrosecond. Other time intervals or even random time intervals could of course be used instead.

Figure 4:
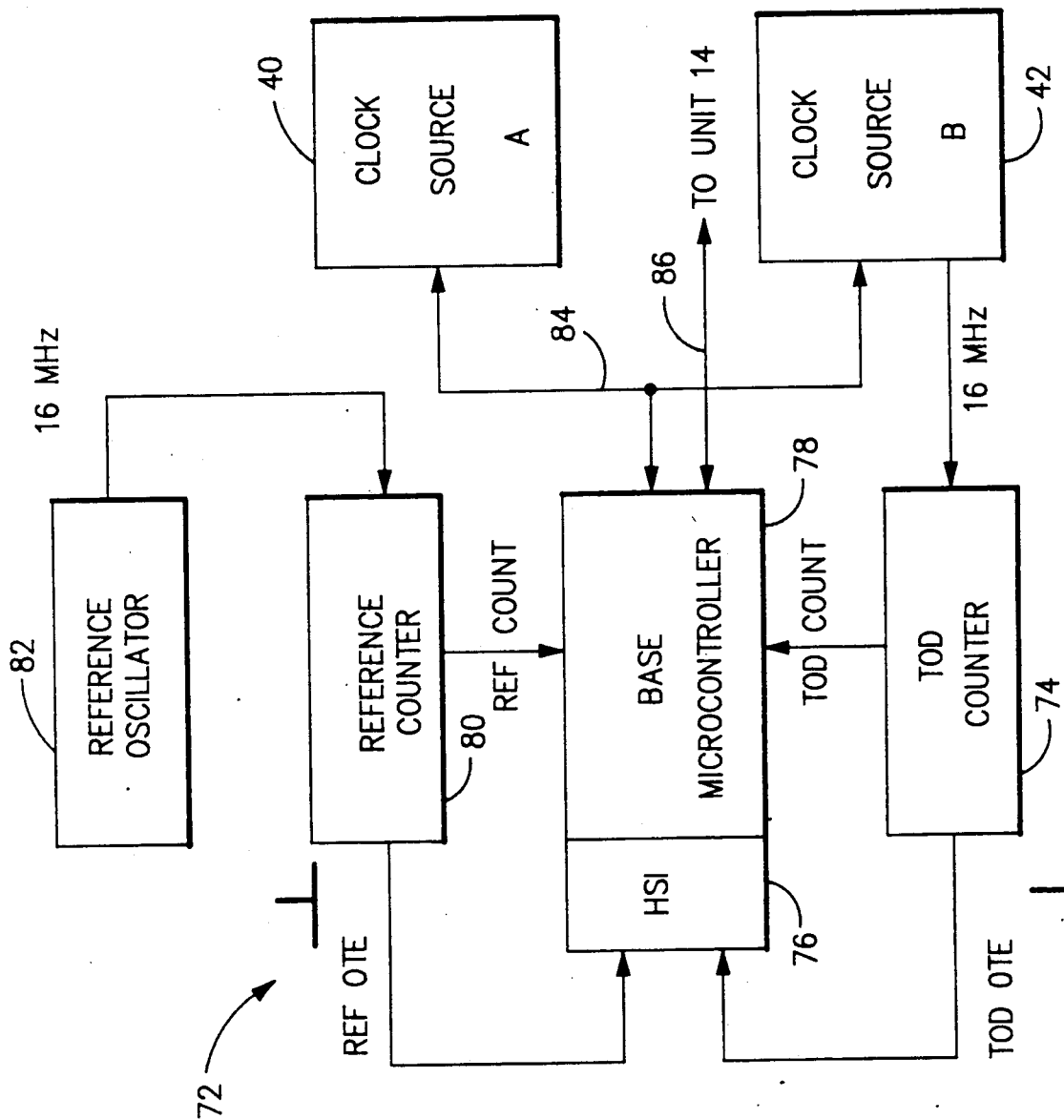
FIG. 4 is a schematic block diagram showing the circuitry for generating the steering signal in one of the external time reference units shown in FIGS. 1 and 2.

Referring now to FIG. 4, the steering signal generating circuit 72 for the units 12 and 14 is conveniently associated with one of the external time reference units, in this particular example unit 12. Circuit 72 contains a time-of-day (TOD) counter 74 together with a reference counter 80. TOD counter 74 receives a 16 MHz signal from the oscillator 60 of clock source 42 corresponding to the oscillator 60 of clock source 40 shown in FIG. 3. In a similar manner, reference counter 80 receives a 16 MHz signal from a reference oscillator 82 having a higher precision than the oscillator 60 of clock source 42. Counters 74 and 80 generate respective parallel count outputs TOD COUNT and REF COUNT which are supplied to base microcontroller 78. Counters 74 and 80 also provide respective on-time-event (OTE) pulses TOD OTE and REF OTE every $2^{24}$ pulses from oscillator 60 of clock source 42 or reference oscillator 82. Since the design frequencies of both of these frequency sources is 16 MHz, counters 74 and 80 provide OTE pulses that are nominally spaced 1.048576 seconds, or $2^{20}$ microseconds, apart.

A high-speed input (HSI) 76 of base microcontroller 78 receives the TOD OTE signal from TOD counter 74 and the REF OTE signal from reference counter 80. Base microcontroller 78 uses the HSI 76 to time-stamp the respective OTE signals originating from counters 74 and 80 to a resolution of 2.4 microseconds. If the OTE signals occur within approximately 20 milliseconds of one another, the difference in time-stamps becomes the basis for calculating the new steering value to be applied. If the counters 74 and 80 are more than 20 milliseconds apart, the HSI 76 is not used, and microcontroller 78 simply reads the respective counts from counters 74 and 80 to obtain the time difference. Reading the counters 74 and 80 provides a resolution in the millisecond range.

Every Mus period of 1.048576 seconds ($2^{20}$ microseconds), as determined by its own clock, base microcontroller 78 determines the timing error E(n) between the two counters 74 and 80 (measured using either the OTE inputs or the parallel count inputs) and uses this error as a basis for calculating a steering correction signal S(n), which is supplied to the clock sources 40 and 42 of unit 12, as well as to the clock sources 44 and 46 of unit 14, during the subsequent Mus period. Microcontroller 78 supplies the steering signal S(n) to clock sources 40 and 42 of the same unit 12 via bus 84, as noted above. The same signal is also supplied to the clock sources 44 and 46 of the other unit 14 via a line 86. Line 86 may be coupled to unit 14 either by way of one or both of links 16 and 18, using any suitable encoding scheme known to the art, or by way of a separate link if desired. The other unit 14 may contain a base microcontroller similar to microprocessor 78 for supplying the steering signal S(n) to the clock sources 40 and 42 synchronously with the TIME SYNC signal on line 70. The particular system for conveying the steering signal to the clock sources 44 and 46 is not as such part of the present invention. Further details of the interconnections between the base microcontrollers of the two units 12 and 14 and the link adapters 48-54 my be found, however, in the copending application of L. H. Appelbaum et al. referred to above.

FIG. 6 shows a plurality of contiguous steering intervals I(n). Each interval I(n), which is 1 Mus in duration, begins at time T(n) and ends at time T(n+1). Further as shown in FIG. 6, the timing error E(n) as measured at time T(n) is used to generate a steering signal S(n), which is applied to the clock sources 40-46 at time T(n+1). Intervals I(n) alternate between active steering intervals, in which the clock sources 40-46 are steered in such a way as to correct the existing error, and zero steering intervals, in which the clock sources are steered in such a manner as to hold the error between the TOD counter 74 and the reference counter 80 constant. In the particular example shown in FIG. 6, the even-numbered intervals I(0), I(2), etc. are active steering intervals while the odd-numbered intervals I(1), I(3), etc. are zero steering intervals.

Each active steering interval I(n), base microprocessor 78 determines a new active steering value S(n), which is supplied to clock sources 40-46 at time T(n+1), using the formula:

$$S(n) = aE(n) + Z$$

where a is a correction coefficient (conveniently unity) and Z is the most recently calculated value of the "zero point". The zero point is the steering signal that must be applied to effectively "steer zero", that is, maintain a constant time difference between counters 74 and 80. In effect, the zero point Z is a zero offset used to compensate for deviations of the oscillators 60 of clock sources 40-46 from their design frequencies.

The zero point Z is updated each zero steering interval. As noted above, the zero steering intervals I(1), I(3), etc. alternate with the active steering intervals I(0), I(2), etc. During each zero steering interval, the base microprocessor 78 computes an adjusted zero point in accordance with the formula:

$$Z = Z' + b[E(n) - E(n-1)]$$

where Z is the adjusted zero point, Z' is the previous value of the zero point, and b is an adjustment coefficient (again conveniently unity). The base microprocessor 78 then uses this recomputed zero point to generate the zero steering signal S(n) in accordance with the formula:

$$S(n) = Z$$

The following recapitulates the calculations performed during the time period T(1)-T(4) as shown in FIG. 6. At T(1), an active steering signal S(1) is calculated in accordance with the formula:

$$S(1) = E(1) + Z(0)$$

where E(1) is the error (TOD count minus reference count) at T(1) and Z(0) is the zero point calculated at the most recent adjustment time T(0). Microcontroller 78 applies steering signal S(1) at time T(2) for use during the next active steering interval I(2).

At time T(2), a zero calculation time, the zero point is first adjusted in accordance with the formula:

$$Z(2) = Z(0) + E(2) - E(1)$$

where E(1) and E(2) are the errors at T(1) and T(2), respectively. The adjusted zero point Z(2) is then used to calculate a zero steering signal S(2) in accordance with the formula:

$$S(2) = Z(2).$$

Microcontroller 78 applies steering signal S(2) to clock sources 40-46 at time T(3) for use during the next zero steering interval I(3).

At time T(3) a new active steering signal S(3) is calculated in accordance with the formula:

$$S(3) = E(3) + Z(2)$$

where E(3) is the error at time T(3) and Z(2) is the adjusted zero point referred to above that was calculated at T(2). Microcontroller applies steering signal S(3) to clock sources at time T(4) for use during the next active steering interval I(4).

Microcontroller 78 alternates in a similar manner between active steering calculations and zero steering calculations at successive times T(n). In each instance, the steering signal S(n) calculated at time T(n) is not applied to the clock sources 40-46 at time T(n) for use during the immediately succeeding interval I(n), but is applied at time T(n+1) for use during interval I(n+1). This delay interval is inserted to ensure that all clock sources 40-46 receive the steering signal S(n) at the same time. By "zero steering" the clock sources 40-46 during the delay interval between the time T(2n+1) that an active steering signal S(2n+1) is calculated and the time T(2n+2) that it is applied to the clock sources, one ensures that the steering error at the time the steering signal is applied is substantially that measured when the steering signal was calculated.

The zero steering interval also provides an occasion for adjusting the zero offset Z in the manner described above. In the absence of such adjustment, some residual time error between the TOD counter 74 and the reference counter 82 would generally exist because of system tolerances. By dynamically adjusting the zero offset Z to account for such system tolerances, the residual error can be reduced to a negligible quantity.

Although the procedure described above, with alternating zero steering signals and proportional active steering signals, is preferable to fixed-magnitude steering signals when the error E(n) approaches zero, fixed-magnitude steering signals may be preferable on system startup when the error may be relatively large. Accordingly fixed-magnitude steering signals are preferably applied at the outset (with a sign depending on the sign of the error), and the above procedure initiated only when the absolute value of the error drops below a predetermined threshold (e.g. 1 millisecond). To prevent the undesirable situation of having the system switching back and forth between the constant-steering and proportional-steering modes of operation, the proportional-steering mode of the present invention, once initiated, is preferably terminated only when the absolute value of the error E(n) climbs above a second threshold (e.g. 20 milliseconds) higher than the first threshold.

While the invention has been particularly shown and described with reference to preferred embodiments, it will be understood by those skilled in the art that various changes in form and details may be made therein without departing from the spirit and scope of the invention.

What is claimed is:

1. A time reference comprising a variable-frequency controlled oscillator having a certain precision, a reference oscillator having a precision higher than that of said controlled oscillator, a controlled counter coupled to said controlled oscillator, a reference counter coupled to said reference oscillator, means for comparing the counts stored in said counters to provide an error signal, and steering means responsive to said error signal for providing a proportional steering signal for controlling the frequency of said controlled oscillator, said steering means alternating between a first mode of operation in which said controlled oscillator is controlled so as to maintain a constant difference between said counts and a second mode of operation in which said controlled oscillator is controlled so as to reduce the difference between said counts.

2. Apparatus as in claim 1 in which said counts are compared at discrete instants of time.

3. Apparatus as in claim 1 in which said counters generate parallel outputs indicating said counts, said comparing means comparing said parallel outputs to determine the difference therebetween.

4. A time reference comprising a variable-frequency controlled oscillator having a certain precision, a reference oscillator having a precision higher than that of said controlled oscillator, a controlled counter coupled to said controlled oscillator, a reference counter coupled to said reference oscillator, said counters generating respective count signals upon reaching predetermined counts, means for comparing the counts stored in said counters to provide an error signal, said comparing means measuring the time difference between said count signals, and steering means responsive to said error signal for providing a proportional steering signal for controlling the frequency of said controlled oscillator.

5. Apparatus as in claim 4 in which said counters generate parallel outputs indicating said counts, said comparing means measuring the time difference between said count signals if occurring within a predetermined interval of one another and comparing said parallel outputs if said count signals do not occur within a predetermined interval of one another.

6. A time reference comprising a plurality of mutually phase-locked controlled oscillators having a certain precision, each of which receives a phase-lock correction signal locking its phase to the remainder of said plurality of oscillators, a reference oscillator having a precision higher than that of said controlled oscillators, a controlled counter coupled to one of said controlled oscillators, a reference counter coupled to said reference oscillator, means for comparing the counts stored in said counters to provide an error signal, and steering means responsive to said error signal for providing a proportional steering signal for controlling the frequency of said controlled oscillators, said steering signal being superimposed on each of said correction signals.

7. A method of synchronizing a variable-frequency controlled oscillator having a certain precision with a reference oscillator having a precision higher than that of said controlled oscillator comprising the steps of incrementing a controlled count in response to said controlled oscillator, incrementing a reference count in response to said reference oscillator, comparing said counts to obtain an error signal, and providing a proportional steering signal for controlling the frequency of said controlled oscillator in response to said error signal, said steering signal including a zero offset.

8. A method as in claim 7 comprising the further step of adjusting said offset.

9. A method as in claim 8 in which said offset is adjusted periodically.

10. A method as in claim 8 in which said offset is adjusted in response to said error signal.

11. A method as in claim 8 in which said offset is adjusted in such a manner that, when it is applied alone as a steering signal, the frequency of said controlled oscillator tracks that of the reference oscillator.

12. A method as in claim 8 comprising the further steps of applying said offset alone as a steering signal during a predetermined time interval, determining the divergence of said counts during said time interval, and adjusting said offset in accordance with said divergence.

13. A method as in claim 7 in which said steering signal is determined in accordance with the formula $$S = aE + Z,$$

where S is the value of said steering signal, E is the value of said error signal, a is a correction coefficient and Z is said zero offset.

14. A method as in claim 13 in which said steering signal is an active steering signal applied during active steering intervals, said active steering intervals alternating with zero steering intervals in which a zero steering signal comprising only said zero offset is applied.

15. A method as in claim 14 in which said zero offset is adjusted after each zero steering interval in accordance with the formula $$Z = Z' + b(E2 - E1),$$

where Z is the adjusted value of the zero offset, Z' is the previous value of the zero offset, b is an adjustment coefficient, E2 is the difference between the counts at the end of the zero steering interval, and E1 is the difference between said counts at the beginning of said zero steering interval.

16. A method of synchronizing a variable-frequency controlled oscillator having a certain precision with a reference oscillator having a precision higher than that of said controlled oscillator comprising the steps of incrementing a controlled count in response to said controlled oscillator, incrementing a reference count in response to said reference oscillator, comparing said counts to obtain an error signal, and providing a steering signal for controlling the frequency of said controlled oscillator in response to said error signal, said steering signal being a proportional steering signal for error signals within a predetermined range of absolute values and being a constant steering signal for error signals beyond said predetermined range.

17. A method of synchronizing a variable-frequency controlled oscillator having a certain precision with a reference oscillator having a precision higher than that of said controlled oscillator comprising the steps of incrementing a controlled count in response to said controlled oscillator, incrementing a reference count in response to said reference oscillator, comparing said counts to obtain an error signal, and providing a proportional steering signal for controlling the frequency of said controlled oscillator in response to said error signal, said steering signal comprising an active steering signal calculated on the basis of the error signal existing at a first instant of time and applied to said controlled oscillator at a second instant of time separated from said first instant of time by a delay interval.

18. A method as in claim 17 in which said controlled oscillator is provided during said delay interval with a zero steering signal, said zero steering signal being so calculated as to maintain the difference between said controlled count and said reference count constant during said delay interval.

19. A method of synchronizing a variable-frequency controllable clock with a reference clock, said controllable clock and said reference clock having respective times associated therewith, said method including the steps of:

generating an error signal indicative of the time difference between said controllable clock and said reference clock;

providing a proportional correction signal for controlling the frequency of said controllable clock in response to said error signal, said correction signal including an offset; and adjusting said offset in response to said error signal.

20. A method as in claim 19 in which said adjusting step includes the steps of:

applying said offset alone to said controllable clock as a correction signal during a predetermined time interval;

determining the change in said error signal during said time interval; and adjusting said offset in accordance with said change.

* * * * *